United States Patent [19]

Schinella et al.

[11] Patent Number: 5,895,261

[45] Date of Patent: Apr. 20, 1999

[54] PROCESS FOR MAKING INTEGRATED CIRCUIT STRUCTURE COMPRISING LOCAL AREA INTERCONNECTS FORMED OVER SEMICONDUCTOR SUBSTRATE BY SELECTIVE DEPOSITION ON SEED LAYER IN PATTERNED TRENCH

[75] Inventors: Richard Schinella, Saratoga; Mahesh K. Sanganeria, Sunnyvale, both of Calif.

[73] Assignee: LSI Logic Corporation, Milpitas, Calif.

[21] Appl. No.: 08/873,809

[22] Filed: Jun. 12, 1997

Related U.S. Application Data

[63] Continuation of application No. 08/552,461, Nov. 9, 1995, Pat. No. 5,670,425.

[51] Int. Cl.[6] ................................................ H01L 21/441
[52] U.S. Cl. ...................... 438/586; 438/677; 438/641; 438/674; 438/682; 438/683
[58] Field of Search ......................... 438/586, 645, 438/626, 629, 641, 675, 677, 674, 682, 683

[56] References Cited

U.S. PATENT DOCUMENTS

| 4,822,753 | 4/1989 | Pintchovski et al. | 437/192 |
|---|---|---|---|
| 4,952,521 | 8/1990 | Goto | 437/33 |
| 4,957,777 | 9/1990 | Ilderem et al. | |
| 5,173,450 | 12/1992 | Wei | 437/200 |
| 5,242,847 | 9/1993 | Ozturk et al. | |
| 5,354,712 | 10/1994 | Ho et al. | 437/195 |
| 5,484,747 | 1/1996 | Chien | 437/190 |
| 5,605,865 | 2/1997 | Maniar et al. | |
| 5,654,245 | 8/1997 | Allen | 438/629 |
| 5,670,425 | 9/1997 | Schinella et al. | |

OTHER PUBLICATIONS

Kato, M., et al. "Nucleation Control of Silicon Germanium on Silicon Oxide for Selective Epitaxy and Polysilicon Formation in Ultraclean Low–Pressure CVD", *Extended Abstracts of the 22nd (1990 International) Conference on Solid State Devices and Materials*, Sendai, Japan, Aug. 22–24, 1990, pp. 329–332.

*Primary Examiner*—Caridad Everhart

[57] ABSTRACT

A local area interconnect structure comprising one or more electrically conductive interconnects formed from electrically conductive metal compounds is described and a process for forming same. Electrically conductive metal compounds are selectively deposited in one or more trenches which were previously formed in an insulation layer in a configuration conforming to the desired pattern of the electrically conductive interconnects. A seed layer is first selectively formed on surfaces of the trenches and the electrically conductive metal compound is then selectively deposited over the seed layer in the trench, but not on the exposed surfaces of the insulation layer.

7 Claims, 5 Drawing Sheets

```
FORMING AN INSULATING LAYER OVER A
SEMICONDUCTOR SUBSTRATE
```

```
FORMING A PATTERN OF ONE OR MORE
TRENCHES IN THE INSULATING LAYER
CONFORMING TO A DESIRED PATTERN OF
ELECTRICALLY CONDUCTIVE INTERCONNECTS
```

```
SELECTIVELY FORMING A SEED LAYER
ONLY ON THE SURFACES OF THE ONE
OR MORE TRENCHES
```

```
SELECTIVELY FORMING AN ELECTRICALLY
CONDUCTIVE METAL COMPOUND ONLY OVER
THE SEED LAYER IN THE ONE OR MORE
TRENCHES TO FORM THE DESIRED PATTERN
OF ONE OR MORE ELECTRICALLY
CONDUCTIVE INTERCONNECTS
```

PROCESS FOR MAKING INTEGRATED CIRCUIT STRUCTURE COMPRISING LOCAL AREA INTERCONNECTS FORMED OVER SEMICONDUCTOR SUBSTRATE BY SELECTIVE DEPOSITION ON SEED LAYER IN PATTERNED TRENCH

"CROSS-REFERENCE TO RELATED APPLICATION"

"This application is a continuation of U.S. patent application Ser. No. 08/552,461, filed Nov. 9, 1995 U.S. Pat. No. 5,679,425, issued Sep. 23, 1997."

BACKGROUND OF THE INVENTION

1. Field of the Invention

This invention relates to the forming of local area interconnects in an integrated circuit structure by selective deposition of conductive material on a patterned seed layer formed over a semiconductor substrate.

2. Description of the Related Art

Figure 1:
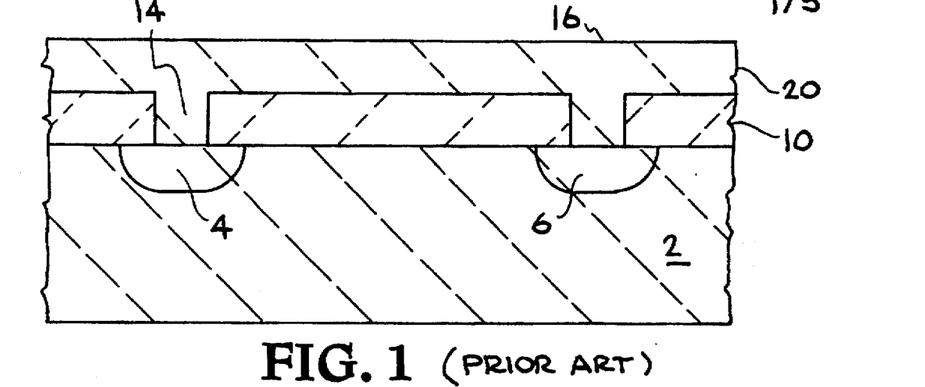
FIG. 1 is a vertical cross-sectional view of a prior art integrated circuit structure having a blanket layer of polysilicon formed over an insulation layer on a semiconductor substrate having MOS structures formed therein.
Figure 2:
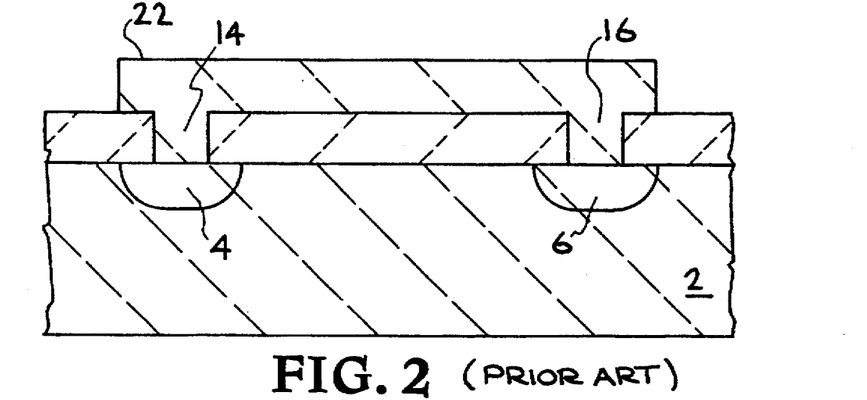
FIG. 2 is a vertical cross-sectional view of the prior art integrated circuit structure of FIG. 1 after the blanket layer of polysilicon has been masked and etched to form a conductive interconnect between adjacent MOS structures.

Local area interconnects are used to provide electrical connections or interconnects between active and or passive devices of an integrated circuit structure at a level or levels below the customary metallization levels. Usually such interconnects involve the use of patterned polysilicon which has been doped to increase its conductivity. A doped layer of polysilicon is blanket deposited over the integrated circuit structure (or blanket deposited undoped and then doped), and then patterned, typically by masking and etching, to provide the desired interconnect or wiring structure. This is illustrated in prior art FIGS. 1 and 2, wherein a semiconductor substrate 2 is shown having portions of MOS devices formed therein comprising, for example, a source region 4 of a first MOS device and a source 6 of a second MOS device. An insulation layer 10 is shown formed over substrate 2 with contact openings 14 and 16, respectively, formed in insulation layer 10 to underlying sources 4 and 6. A doped polysilicon layer 20 is blanket deposited over insulation layer 10 and in contact openings 14 and 16. As shown in FIG. 2, polysilicon layer 20 is then patterned, using an appropriate mask and etching, to form conductive interconnect 22 to electrically interconnect sources 4 and 6 of the two MOS devices.

While such polysilicon interconnect structures are useful, extensive electrical interconnection at this level is usually avoided because of the less than satisfactory conductivity of the doped polysilicon, in comparison with upper metallization layers which are usually formed from a more conductive material, i.e., a metal such as aluminum.

Because of the desire to provide electrical interconnections at this level, and the low conductivity of doped polysilicon, attempts have been made to substitute more conductive materials such as metal silicides or metal nitrides for the polysilicon, due to the enhanced conductivity of, for example, titanium silicide in comparison to doped polysilicon. However, such technology has never become popular because of the relative difficulty in patterning such materials, in comparison with either polysilicon or upper metallization layers, when the material is first formed by a blanket deposition, similar to the blanket layer of polysilicon shown in FIG. 1, and then masked and etched to form the desired patterning of the layer of conductive material into interconnects, similar to the patterned polysilicon interconnect shown in FIG. 2.

However, if such problems could be overcome, the use of local area interconnect technology as part of the overall metallization interconnect technology for multiple level interconnects could provide improvements in device packing densities.

SUMMARY OF THE INVENTION

It has now been discovered that a local area interconnect structure may be formed by selective deposition of certain conductive metal compounds over a seed layer previously formed in one or more trenches in an insulation layer wherein the one or more trenches have been previously formed in a pattern conforming to the desired interconnect configuration, so that the objectionable prior art step of patterning a blanket deposited layer of a conductive metal compound can be eliminated.

DETAILED DESCRIPTION OF THE INVENTION

The invention comprises a local area interconnect structure comprising a conductive metal compound, and the process of forming such an interconnect structure by selective deposition of certain conductive metal compounds over a seed layer previously formed in one or more trenches in an insulation layer wherein the one or more trenches have been previously formed in a pattern conforming to the desired interconnect configuration.

By use of the term "local area interconnect" herein is meant an electrical connection or interconnect between devices of an integrated circuit structure at a level or levels below the customary metallization levels, using a conductive metal compound, rather than a metal.

a. Formation of the Patterned Trench

Figure 3:
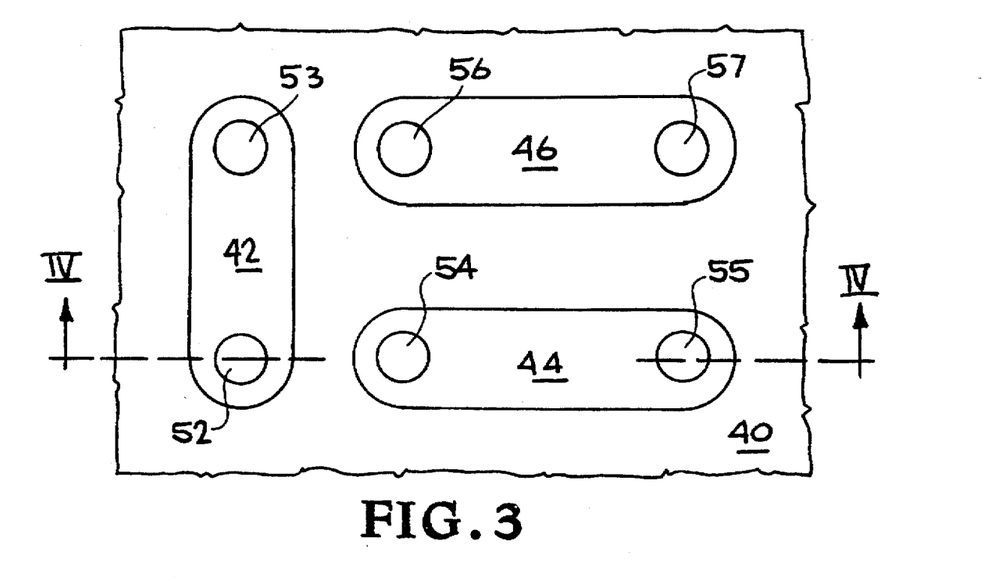
FIG. 3 is a top view of an insulation layer having a pattern of grooves formed in the upper surface of the insulation layer by appropriate masking and etch of the insulation layer.
Figure 4:
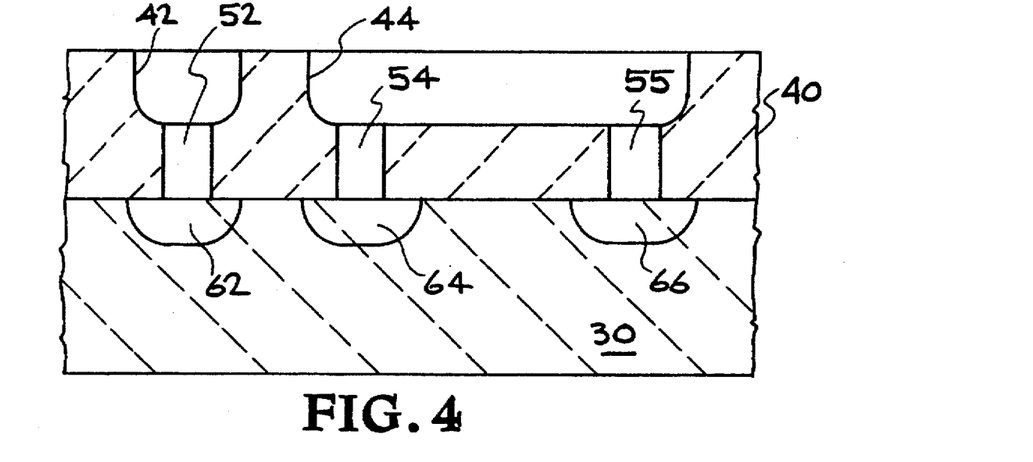
FIG. 4 is a vertical cross-sectional view of the structure of FIG. 3 taken along lines IV—IV.

Since the invention includes the selective deposition of a conductive metal compound only on the surface of a seed layer formed in one or more patterned trenches formed in a dielectric layer, the patterned trench must first be formed. Referring now to FIGS. 3 and 4, trenches 42, 44, and 46 are shown formed in an insulation layer 40, such as a silicon oxide or silicon nitride layer formed over a semiconductor substrate 30, such as a silicon substrate. Trenches 42, 44, and 46 may be formed by first blanket depositing insulation layer 40 over substrate 30 and then forming a mask over insulation layer 40, such as a patterned layer of photoresist. The unmasked portions of insulation layer 40 may then be etched using any appropriate etching procedure such as for example, an anisotropic dry etching technique (e.g., using fluorocarbon chemistry for silicon oxide), or a wet etch (e.g., using HF when insulation layer 40 is silicon oxide) to form trenches or grooves 42, 44, and 46 in insulation layer 40 conforming to the desired pattern for the local area interconnects to be formed in the trenches. Such trenches or grooves 42, 44, and 46 may typically range in depth from about 0.25 micrometers (μm) to about 5.0 μm, although smaller or larger depths may be utilized if desired or needed. Usually the depth of trenches 42, 44, and 46 will conform to the desired thickness (height) of the conductive interconnect to be formed in the trench, although deeper trenches may be formed, provided the structural integrity of the insulation layer is not jeopardized. The width of the trenches will generally depend upon the design geometry of the system, but will generally range between about 0.25 μm to about 4 μm, although smaller or larger widths may be utilized if desired or needed.

As further shown in FIGS. 3 and 4, contact openings 52, 53, 54, 55, 56, and 57 may also be formed, which extend completely through dielectric layer 40 to underlying portions of the integrated circuit structure formed on and in semiconductor substrate 30, such as source regions 62, 64, and 66 of adjacent MOS transistors (the remainder of which are not shown) formed in substrate 30. It will be noted that contact openings 52-57 are shown formed in registry, respectively, with trenches 42, 44, and 46 so that the interconnects which will be formed in trenches 42, 44, and 46 may provide the desired electrical interconnections between the respective portions of the integrated circuit structure exposed by openings 52-57, as will become apparent below.

Figure 4A:
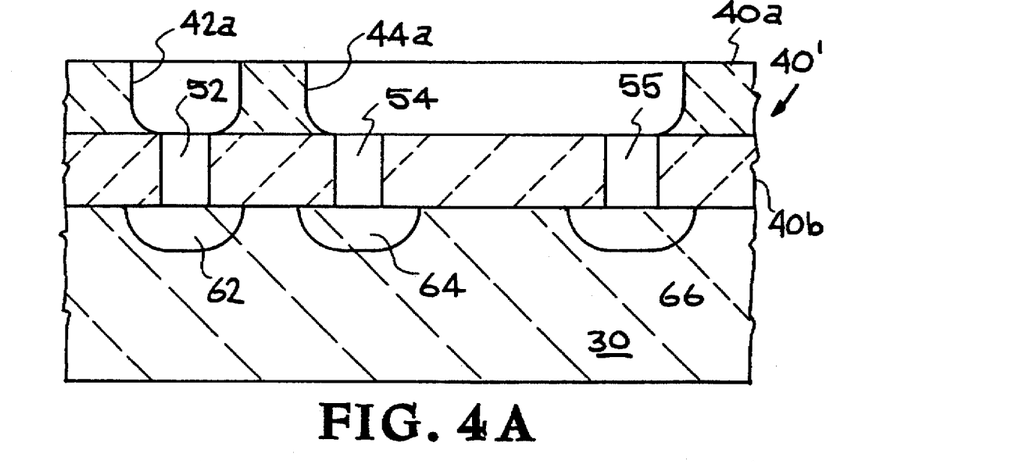
FIG. 4A is a vertical cross-sectional view of an alternate embodiment to the structure shown in FIG. 4.

In another embodiment, as shown in FIG. 4A, insulation layer 40' may comprise a composite layer formed from upper layer 40a and lower layer 40b comprising two different materials which etch at different rates, e.g., silicon oxide and silicon nitride, whereby lower layer 40b will act as an etch stop when etching trenches such as trenches 42a and 44a in upper layer 40a.

Figure 4B:
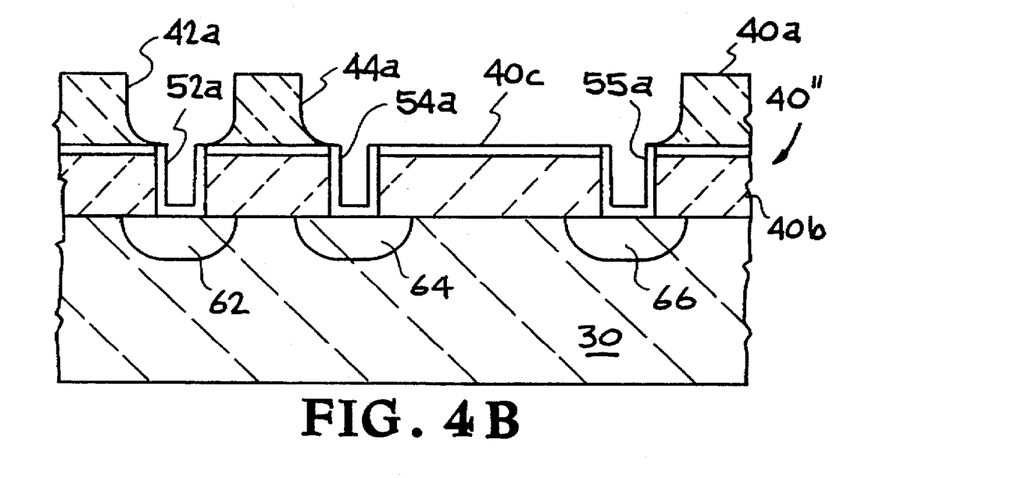
FIG. 4B is a vertical cross-sectional view of yet another alternate embodiment to the structure shown in FIG. 4.

In yet another embodiment, as shown in FIG. 4B, insulation layer 40" may comprise a three layer composite wherein intermediate layer 40c comprises a material which etches at a different rate in certain chemistries than layers 40a and 40b, in which case layers 40a and 40b may, if desired, then comprise the same insulation material (e.g., layers 40a and 40b could comprise silicon oxide while layer 40c could comprise silicon nitride). In this embodiment, layer 40c could act as the etch stop when etching trenches 42b and 44b in upper layer 40a and at the same time layer 40c could act as a protective layer over the surfaces of contact openings 52a, 54a, and 55a, previously formed in lower layer 40b. In that case, layer 40c could then be selectively removed, after formation of trenches 42a and 44a, and prior to deposition of the seed layer, using an etch system which would be selective to layers 40a and 40b, i.e., an etch system which would preferentially etch layer 40c to remove it.

b. Formation of the Seed Layer

Figure 5:
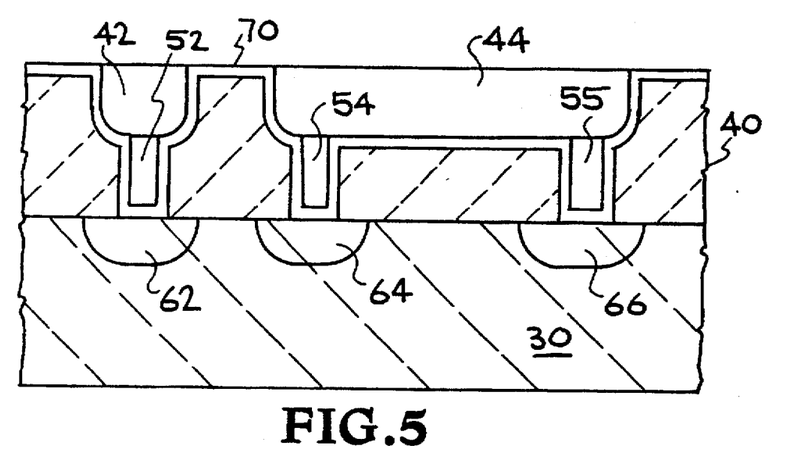
FIG. 5 is a vertical cross-sectional view of the structure of FIG. 4 showing a seed layer blanket deposited over the insulation layer and into the pattern of grooves formed in the surface of the insulation layer.

Turning now to FIG. 5, after formation of the patterned trenches, a thin seed layer 70 is now blanket deposited over insulation layer 40, which coats not only the top surface of insulation layer 40, but also the surfaces, i.e., sidewalls and bottom, of trenches 42, 44, and 46, as well. It will be noted that seed layer 70 is shown as also at least lining the surfaces of contact openings 52, 54, and 55. While normally seed layer 70 will only comprise a rather thin lining in a much larger contact opening (e.g., a 200 Angstrom thick lining in a 5000 Angstrom diameter contact opening), it is within the scope of the invention to fill the entire contact opening with the seed material when the seed material comprises an electrically conductive material such as will be described below.

Seed material 70 normally may comprise any electrically conductive material which is capable of promoting subsequent selective deposition and/or growth of a conductive metal compound thereon which is capable of such selective deposition and/or growth. By "selective" is meant that the subsequently formed selective conductive metal compound will deposited and/or grow only over the seed material and not on the exposed surfaces of insulation layer 40 not covered with such seed material.

It should be noted that while seed material 70 is stated above to comprise any electrically conductive material, seed layer 70 as applied to the surfaces of the trenches need not always comprise an electrically conductive material at the time of deposition. That is, seed material 70 might comprise a non-conductive material which is implanted after deposition to render it conductive; or it may react with, or be consumed by, the conductive metal compound subsequently formed over the seed material to leave only an electrically conductive metal compound in the trenches.

Examples of seed materials which may be used to promote the selective deposition and/or growth of transition metal silicide and/or germanides on an insulation layer such as a silicon oxide or silicon nitride layer include silicon (including polysilicon), germanium, silicon-germanium mixtures, a transition metal nitride such as titanium nitride, or metals and metal alloys such as titanium, platinum, tungsten, or titanium-tungsten alloys.

c. Selective Removal of Portions of the Seed Layer

Figure 6:
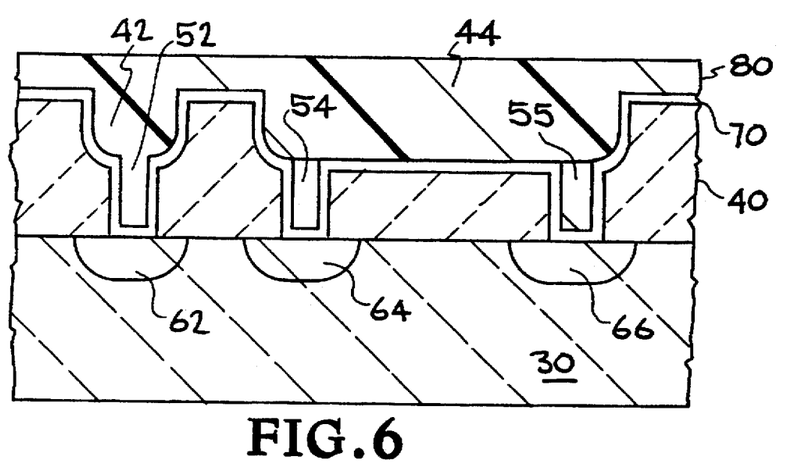
FIG. 6 is a vertical cross-sectional view of the structure of FIG. 5 showing a photoresist layer deposited over the insulation layer and in the pattern of grooves formed in the surface of the insulation layer, filling the grooves and forming a planarized layer over the entire structure.

After the blanket deposition of seed layer 70, in accordance with the invention, those portions of seed layer 70 must be removed. In one embodiment, a photoresist layer 80 may be formed over insulation layer 40 and seed layer 70 thereon which will flow into coated trenches 42, 44, and 46, as well as over the portions of seed layer 70 deposited over the top surface of insulation layer 40, forming planar layer 80 of photoresist, as shown in FIG. 6.

Figure 7:
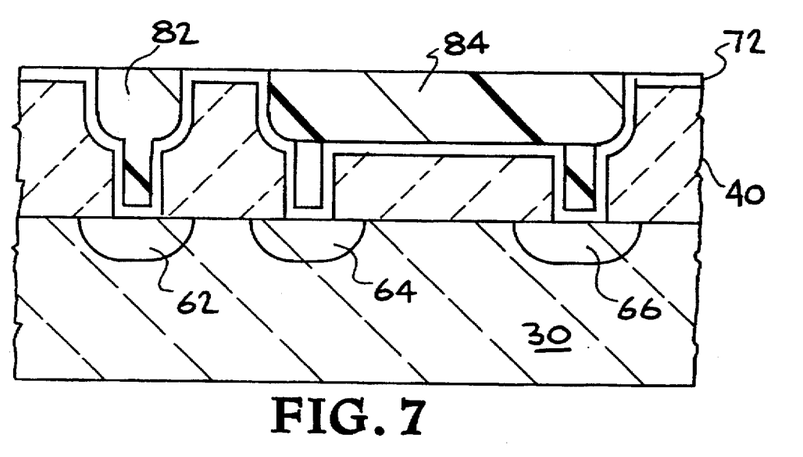
FIG. 7 is a vertical cross-sectional view of the structure of FIG. 6 illustrating the first step in one embodiment of the selective removal of those portions of the seed layer not in the trench, wherein the photoresist layer is blanket etched down to the seed layer on the surface of the insulation layer, leaving a thick layer of photoresist in the grooves over the seed layer formed therein.

To expose the portions of underlying seed layer 70 over the planar upper surface portions of insulation layer 40, i.e., those portions of seed layer 70 not formed over the surfaces of trenches 42, 44, and 46, a blanket anisotropic etch may be performed on photoresist layer 80, until portions 72 of seed layer 70 on the planar upper surface of underlying insulation layer 40 are exposed, as shown in FIG. 7. Such an anisotropic etch may be performed, for example, in a conventional plasma etcher.

Alternatively, to expose those portions of seed layer 70 not on the trench surfaces, photoresist layer 80 could be partially exposed to light energy (to only expose the top portion of the photoresist layer), and then conventionally developed to remove such exposed top portions of the photoresist layer, which would result in removal of the photoresist on those portions of seed layer 70 not lying in the trenches, thereby permitting selective removal of such exposed portions of seed layer 70.

Any other means for selective removal of those portions of seed layer 70 on the planar upper surface of insulating layer 40, i.e., those portions of seed layer 70 not on the trench surfaces, could also be employed, including, for example, a blanket anisotropic etch of seed layer 70 (without any photoresist) which would remove not only those portions of seed layer 70 on the planar surface of underlying insulating layer 40, but also the portions of seed layer 70 on the bottom of the trenches. In that case, the anisotropic nature of the etch would leave portions of seed layer 70 on the sidewalls of the trenches which would provide sufficient seed layer area for the subsequent selective deposition of the electrically conductive metal compound thereon. Chemical/mechanical polishing (CMP) techniques could also be used with either the seed layer alone or the seed layer and overlying photoresist layer to selectively remove the seed layer portions lying on the planar surface of underlying insulating layer 40, i.e., those portions of seed layer 70 not on the trench surfaces.

Figure 8:
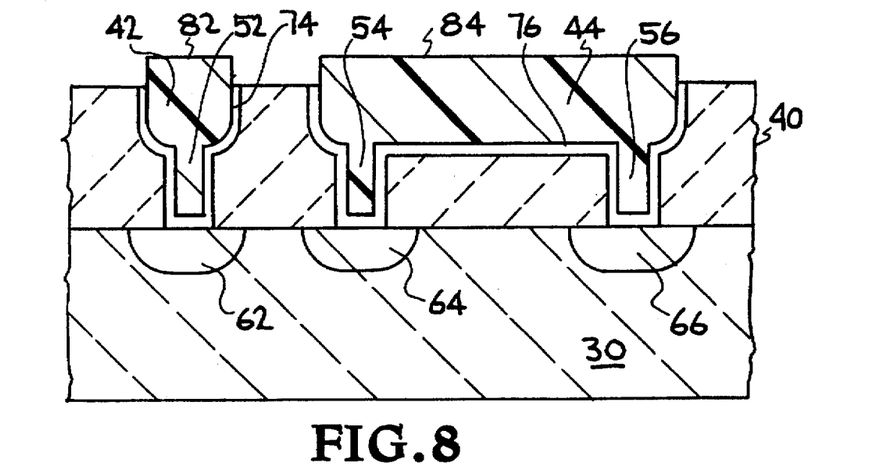
FIG. 8 is a vertical cross-sectional view of the structure of FIG. 7 after a blanket etch to remove the exposed portions of the seed layer on the surface of the insulation layer.

When, as described above in the illustrated embodiment shown in the figures, photoresist is selectively removed to expose only portions 72 of seed layer 70, such portions 72 may then be selectively etched away, using either a dry etch, such as described above, or a wet etchant, e.g., KOH for polysilicon. It should be noted that the anisotropic blanket etch step described above to remove sufficient photoresist to expose portions 72 of seed layer 70 may, in certain instances, be continued to also remove seed layer portions 72, with the etch then stopping when the surfaces of underlying dielectric layer 40 is exposed. This requires an etch system which will etch both photoresist and the seed material (preferably at about the same rate), but will be selective to the underlying dielectric material, i.e., will not etch or have a much smaller rate of etching of the underlying dielectric layer. In any event, selective removal of portions 72 of seed layer 70 will result in the structure shown in FIG. 8, with seed layer portions 74 and 76 respectively remaining in trenches 42 and 44, and with the height of remaining photoresist portions 82 and 84 thereover dependent upon the etch system used to remove seed layer portions 72.

Figure 9:
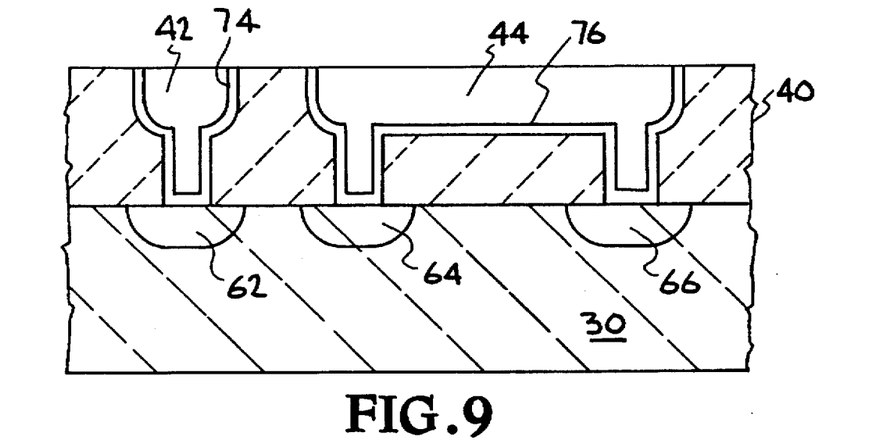
FIG. 9 is a vertical cross-sectional view of the structure of FIG. 8 after removal of the remainder of the photoresist material in the grooves.

After the selective removal of portions 72 of seed layer 70 on the surface of dielectric layer 40 (by any of the above-described methods), only those portions of seed layer 70 (e.g., seed layer portions 74 and 76) which are on the surfaces of the trenches (e.g., trenches 42 and 44) remain. Therefore, (when photoresist is used) remaining photoresist portions 82 and 84 may be selectively removed, using, for example, any conventional solvent capable of removing photoresist without removing either seed layer portions 74 or 76 or exposed portions of dielectric layer 40, e.g., acetone or any other appropriate solvent for the particular photoresist material used. The result, as shown in FIG. 9, is a structure having a pattern of trenches, such as illustrated trenches 42 and 44, each having its surfaces coated with seed material, such as illustrated seed layer portions 74 and 76 shown respectively on the surfaces of trenches 42 and 44 in FIG. 9.

d. Selective Formation of the Electrically Conductive Metal Compound

The selective deposition of an electrically conductive metal compound (or a mixture of two or more such compounds) which will form the desired electrically conductive interconnect may now be carried out. Such electrically conductive interconnects will be formed from those electrically conductive metal compounds capable of selective deposition and/or growth over a seed layer, but not over an insulation layer such as a silicon oxide or silicon nitride layer, selected from the reaction products of metals, preferably transition metals, with Group IV semiconductors.

By use of the term "metals" herein forming reaction products with Group IV semiconductors is meant IUPAC Group IVA, VA, VIA, and VIIA metals such as titanium (Ti), vanadium (V), chromium (Cr), manganese (Mn), zirconium (Zr), niobium (Nb), molybdenum (Mo), technetium (Tc), hafnium (Hf), tantalum (Ta), tungsten (W), and rhenium (Re); or IUPAC Group VIIIA metals (except iron) such as cobalt (Co), nickel (Ni), platinum (Pt), palladium (Pd), ruthenium (Ru), rhodium (Rd), osmium (Os), and iridium (Ir).

By use of the term "transition metals" herein forming reaction products with Group IV semiconductors is meant IUPAC Group IVA, VA, VIA, and VIIA metals such as titanium (Ti), vanadium (V), chromium (Cr), manganese (Mn), zirconium (Zr), niobium (Nb), molybdenum (Mo), technetium (Tc), hafnium (Hf), tantalum (Ta), tungsten (W), and rhenium (Re).

By use of the term "Group IV semiconductors" is meant IUPAC Group IVB elements such as germanium (Ge) and silicon (Si). Of particular interest in such group of compounds are titanium silicide, titanium germanide, titanium silicide/germanide mixtures, cobalt silicide, platinum silicide/germanide, and cobalt silicide/germanide.

The formation of this electrically conductive metal compound which will function as an electrically conductive interconnect will now be described below with respect to the formation of a titanium silicide interconnect, it being understood that this is by way of illustration, and not of limitation, with other selectively depositable electrically conductive metal compounds selected from the reaction products of Groups IVA, VA, VIA, VIIA, and VIIIA (IUPAC) metals with group IV semiconductors, as described above, capable of being substituted for the illustrated titanium silicide.

Titanium silicide is selectively deposited on seed layer portions 74 and 76 in trenches 42 and 44 by flowing gaseous (or vaporous) sources of titanium and silicon into a reaction chamber maintained at a pressure ranging from about 10 milliTorr to about 10 Torr while maintaining the substrate at a temperature ranging from about 500° C. to about 800° C. Typically, for a 12 inch high 12 inch diameter reaction chamber and a substrate having a diameter of about 6–8 inches, a gaseous source of titanium such as $TiCl_4$ will be flowed into the chamber at a rate of from about 2 to about 20 standard cubic centimeters per minute (sccm); a source of silicon, such as silane, will be flowed into the chamber at a rate of from about 1 to about 50 sccm; and an optional carrier gas such as hydrogen at a rate of from 0 to 1000 sccm.

The deposition time period for the selective deposition over the seed layer portions may be controlled by monitoring the deposition or by empirical determinations based on previous depositions into trenches of known depth for known periods of time, with known amounts (thicknesses) of seed layer previously formed therein. The amount of conductive metal compound to be deposited preferably will be that amount which will just fill trenches 42, 44, and 46 so as to provide a generally planarized surface to facilitate construction of further integrated circuit structure thereon, i.e., further insulation layers and metallization layers which will require planarized surfaces to permit photolithographic steps to be accurately carried out thereon. However, when deep trenches are used, i.e., trenches deeper than the desired thickness of the interconnect, the amount to be deposited will be that amount which will at least partially fill the trenches sufficiently to provide at least about 1000 Angstroms of continuous film.

Figure 10:
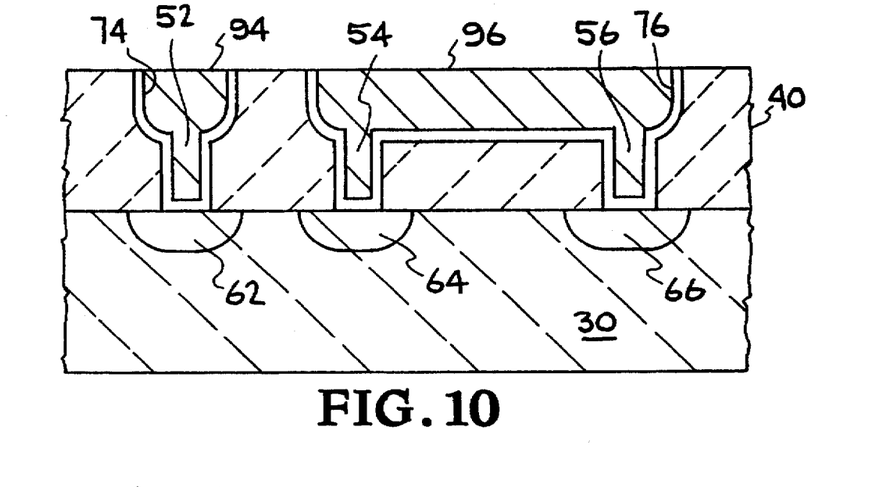
FIG. 10 is a vertical cross-sectional view of the structure of FIG. 9 after a selective deposit of a metal compound over the seed layer in the trench, but not on the surface of the insulation material.
Figure 11:
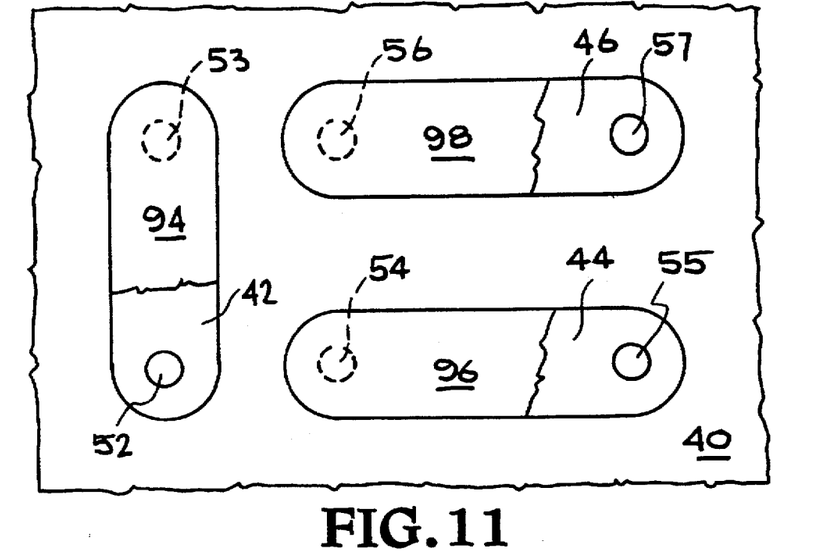
FIG. 11 is a partially cutaway top view of the structure formed in FIG. 10, showing the insulation layer with a patterned interconnect of conductive metal compound thereon resulting from the process of the invention.
Figure 12:
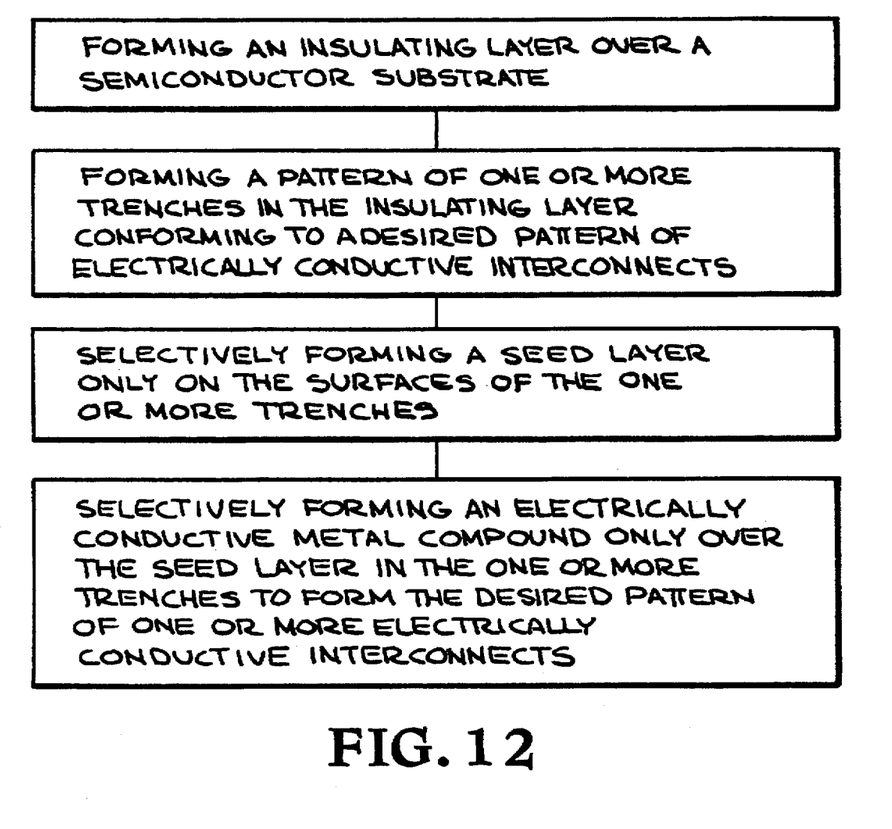
FIG. 12 is a flow sheet illustrating the process of the invention.

The result, as shown in both FIGS. 10 and 11, is a patterned electrically conductive interconnect, comprising titanium silicide portions 94, 96, and 98, respectively formed selectively only in trenches 42, 44, and 46, to provide electrical interconnections between devices in the integrated circuit structure, such as the illustrated electrical interconnections shown formed between source regions 64 and 66 of adjacent MOS devices through contact openings 54 and 56 in FIG. 10.

Thus, the invention comprises an integrated circuit structure and a process of making same wherein conductive interconnects or "local area interconnects" comprising metal compounds are formed without the need to pattern a previously formed layer of such a metal compound. Such an integrated structure constructed in accordance with the invention may find utility in any electrical/electronic system using "IC's" or integrated circuit substrates. Thus, the structure and process of the present invention may be utilized in system level products comprising single chip modules (SCM) often including other electrical components (such as capacitors, resistors, inductors, etc.); multi-chip modules (MCM) having at least two integrated circuit die in the same or separate packages, with or without other electrical components; board level products (BLP) such as those having multiple integrated circuits on printed wiring board(s) (PWB); and box level products (Boxes) which may include a combination of elements from the list of SCM, MCM, BLP, and the like. One or more of such SCM, MCM, PWB, or BLP's may act as, or be integrated into a functional system or subsystem. The system level products contemplated include digital data storage; security and surveillance systems, general purpose computers (such as personal computers, work stations, servers, mini computers, mainframe computers and super computers); digital audio and video compression and transmission; transportation vehicles (such as airplanes, trains, automobiles, helicopters, rockets, missiles, boats, submarines, and the like); subsystems utilized in such vehicles (such as navigational positioning, i.e., Global Positioning System (GPS), navigational displays and controllers, hazard avoidance such as radar and sonar, fly by wire control, and digital engine control and monitoring); entertainment systems (such as digital television and radio, digital cameras, audio and video recorders, compact disc players, digital tape, or the like); and communications (such as PBX, telephone switching, voice mail, auto attendant, network controllers, video teleconferencing, digital data transmission (such as token ring, ethernet, ATM, or the like)); and subsystems or subassemblies for inclusion or attachment to more complex system level products.

Having thus described the invention what is claimed is:

1. A process for forming one or more electrically conductive interconnects over a semiconductor substrate which comprises:

a) forming an insulation layer over a semiconductor substrate;

b) forming one or more trenches in, but not completely through said insulation layer conforming to the desired shape of said one or more electrically conductive interconnects;

c) thereafter forming only in said one or more trenches in said insulation layer a seed layer patterned by said one or more trenches into the desired shape of said one or more electrically conductive interconnects; and d) then selectively forming an electrically conductive metal compound directly over only said patterned seed layer in said one or more trenches;

whereby said electrically conductive metal compound selectively formed only over said patterned seed layer will conform to the pattern of said seed layer to form said one or more electrically conductive interconnects.

2. The process of forming one or more electrically conductive interconnects of claim 1 wherein said step of depositing said seed layer in said one or more trenches conforming to the desired shape of said one or more electrically conductive interconnects further comprises depositing in said one or more trenches a seed layer selected from the group consisting of silicon, germanium, silicon-germanium mixtures, transition metal nitrides, titanium, platinum, tungsten, and titanium tungsten alloys.

3. The process of forming one or more electrically conductive interconnects of claim 1 wherein said step of depositing said seed layer in said one or more trenches conforming to the desired shape of said one or more electrically conductive interconnects further comprises depositing in said one or more trenches a seed layer selected from the group consisting of silicon, germanium, silicon-germanium mixtures, and titanium nitride.

4. A process for forming one or more electrically conductive local area interconnects over a semiconductor substrate which comprises:

a) forming over a semiconductor substrate, a seed layer patterned into the desired shape of said one or more electrically conductive interconnects; and b) selectively forming titanium silicide only over said patterned seed layer;

whereby said titanium silicide selectively formed only over said patterned seed layer will conform to the pattern of said seed layer to form said one or more electrically conductive local area interconnects.

5. The process of claim 4 wherein said seed layer is deposited in one or more trenches patterned to conform to the desired shape of said one or more electrically conductive interconnects.

6. The process of forming one or more electrically conductive local area interconnects of claim 5 wherein said step of depositing said seed layer in said one or more trenches conforming to the desired shape of said one or more electrically conductive interconnects further comprises depositing in said one or more trenches a seed layer selected from the group consisting of silicon, germanium, silicon-germanium mixtures, transition metal nitrides, titanium, platinum, tungsten, and titanium tungsten alloys.

7. A process for forming one or more electrically conductive local area interconnects over a semiconductor substrate which comprises:

a) forming an insulation layer over a semiconductor substrate;

b) forming one or more trenches in, but not completely through said insulation layer conforming to the desired shape of said one or more electrically conductive local area interconnects;

c) thereafter forming a seed layer only in said one or more trenches, said seed layer thereby patterned by said trenches into the desired shape of said one or more electrically conductive interconnects, said seed layer selected from the group consisting of silicon, germanium, silicon-germanium mixtures, transition metal nitrides, titanium, platinum, tungsten, and titanium tungsten alloys; and d) then selectively forming titanium silicide only over said patterned seed layer;

whereby said titanium silicide selectively formed only over said patterned seed layer will conform to the pattern of said seed layer in said one or more trenches to form said one or more electrically conductive local area interconnects.

* * * * *